(12) United States Patent
Brinkmann et al.

(10) Patent No.: US 7,838,074 B2
(45) Date of Patent: Nov. 23, 2010

(54) METHOD FOR PREPARING AN ORIENTED AND NANOSTRUCTURED SURFACE OF A POLYMER

(75) Inventors: Martin Brinkmann, Marienthal (FR); Jean-Claude Wittmann, Pfluggriesheim (FR)

(73) Assignee: Centre National de la Recherche Scientifique (CNRS), Paris Cedex (FR)

( * ) Notice: Subject to any disclaimer, the term of this patent is extended or adjusted under 35 U.S.C. 154(b) by 0 days.

(21) Appl. No.: 12/088,830

(22) PCT Filed: Sep. 28, 2006

(86) PCT No.: PCT/FR2006/002201

§ 371 (c)(1),
(2), (4) Date: Jul. 16, 2008

(87) PCT Pub. No.: WO2007/036639

PCT Pub. Date: Apr. 5, 2007

(65) Prior Publication Data

US 2009/0130402 A1     May 21, 2009

(30) Foreign Application Priority Data

Sep. 29, 2005    (FR) ................................. 05 09930

(51) Int. Cl.
*B32B 5/14* (2006.01)
(52) U.S. Cl. ....................................... 427/335; 427/307
(58) Field of Classification Search ................. 427/307, 427/335
See application file for complete search history.

(56) References Cited

U.S. PATENT DOCUMENTS

| 4,824,699 | A | * | 4/1989 | Woo et al. ................... 427/307 |
| 4,868,006 | A | | 9/1989 | Yorkgitis et al. |
| 5,731,405 | A | | 3/1998 | Gibbons et al. |
| 2002/0077378 | A1 | * | 6/2002 | Chonde et al. ................ 521/82 |

(Continued)

FOREIGN PATENT DOCUMENTS

| EP | 1241209 A2 | 9/2002 |
| WO | 02/50170 A1 | 6/2002 |

OTHER PUBLICATIONS

I. Lieberwirth, et al., "Nanostructured Polymer Films by Electron-Beam Irradiation and Selective Metallization," Advanced Materials, Apr. 27, 1998, pp. 997-1001, vol. 10, No. 13.

(Continued)

*Primary Examiner*—Timothy H Meeks
*Assistant Examiner*—Nathan T Leong
(74) *Attorney, Agent, or Firm*—Sughrue Mion, PLLC

(57) ABSTRACT

The invention concerns a method for preparing a substrate one surface of which consists of a polymer, said polymer surface being oriented and nanostructured, said method including the following successive steps: a) brushing the polymer surface in an amorphous state of the substrate; b) contacting with a vapor of a solvent, the oriented polymer surface obtained at the end of step a), said solvent being selected such that: $|\delta_{poly}-\delta_{sol}|/[(\delta_{poly}+\delta_{sol})/2]<0.3$, $\delta_{poly}$ and $\delta_{sol}$ representing respectively the solubility parameters of the polymer and of the solvent, and $\gamma_{sol}<\gamma_{poly}$, $\gamma_{sol}$ et $\gamma_{poly}$ representing respectively the free surface energies of the solvent and the polymer. The invention concerns a substrate one polymer surface of which at least is oriented and nanostructured, and the various uses of said substrate.

16 Claims, 16 Drawing Sheets

U.S. PATENT DOCUMENTS

Figure 1:
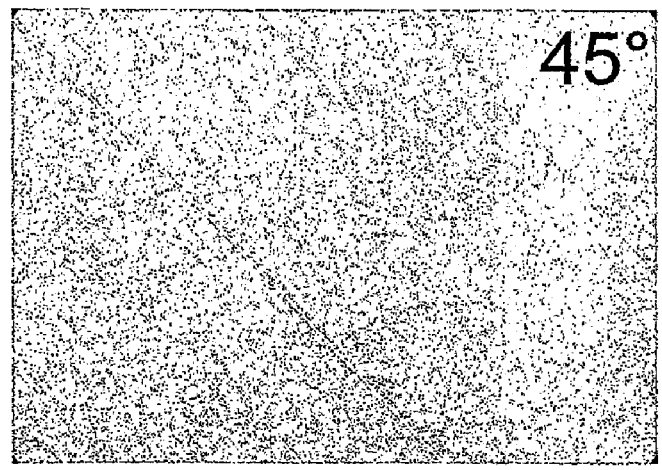

| | | | |
|---|---|---|---|
| 2003/0001317 A1 | 1/2003 | Stafford et al. | |
| 2003/0025228 A1* | 2/2003 | Prieur-Blanc et al. | 264/2.6 |
| 2003/0152726 A1 | 8/2003 | Stafford et al. | |
| 2003/0218701 A1* | 11/2003 | Kawakami | 349/65 |
| 2004/0167218 A1* | 8/2004 | Sly | 514/547 |
| 2004/0219364 A1* | 11/2004 | Shirk et al. | 428/411.1 |

OTHER PUBLICATIONS

S. Steudel, et al., "Influence of the Dielectric Roughness on the Performance of Pentacene Transistors," Applied Physics Letters, Nov. 8, 2004, pp. 4400-4402, vol. 85, No. 19.

J.C. Wittmann, et al., "Highly Oriented Thin Films of Poly(tetrafluoroethylene) as a Substrate for Oriented Growth of Materials," Nature, Aug. 1, 1991, pp. 414-417, vol. 352.

J. Petermann, et al., "A New Method for the Preparation of High Modulus Thermoplastic Films," Journal of Materials Science, Jan. 5, 1979, pp. 2260-2264.

M. Brinkmann, et al., "Orienting Tetracene and Pentacene Thin Films onto Friction-Transferred Poly(tetrafluoroethylene) Substrate," J. Phys. Chem., Aug. 28, 2003, pp. 10531-10539, vol. 107, No. 38.

* cited by examiner

μm

2μm

METHOD FOR PREPARING AN ORIENTED AND NANOSTRUCTURED SURFACE OF A POLYMER

The present invention relates to a process for preparing a substrate at least one surface of which is constituted by a polymer, to a substrate of this type, and to various uses of this substrate.

More particularly, the process of the invention is intended for the preparation of substrates the surface of which is both orientated on the molecular scale and nanostructured, allowing the orientated deposition of various molecular and macromolecular systems. Such substrates are of particular use in the fields of optics, plastic electronics or for the fabrication of field effect transistors.

Methods are already known which can produce nanostructured polymer surfaces; further, methods are also known which can produce orientated polymer surfaces.

Nanostructuring polymer substrates can control physical and physico-chemical surface properties as diverse as anti-reflective optical properties, adhesive properties and the orientation of motor proteins or wetting and flow properties close to a surface. Methods for the periodic nanostructuring of polymer surfaces primarily make use of block copolymers (as described in particular in the publication by Li and Yokohama, Adv Mat 17, 2005, 1432). The block copolymers used are amorphous. That type of nanostructured surface does not allow the molecules or macromolecules deposited on the substrate to be orientated.

Orientated polymer surfaces which can produce large surface areas of the order of several $cm^2$ are produced using three methods.

In the first method, used in the field of liquid crystal displays, layers of polyimide with a high orientating power were obtained by a conventional surface brushing process which induces a superficial orientation of the polymer chains (S Steudal et al, Appl Phys Lett, 85, 2004, 4400). This method, however, suffers from a number of disadvantages: the need to use a pre-polymer for solubility reasons, the use of high temperatures (300° C.) which are ill-suited to the constraints associated with the production of all-polymer devices, and considerable roughness of the polymer substrate, which is ill-adapted to the production of organic field effect type transistors.

In a second method, described in U.S. Pat. No. 5,731,405, polyimide films or liquid crystal polymer materials are irradiated with polarized UV, which necessitates the synthesis of polymers with a liquid crystal nature. The principal drawback with that method resides in the fact that the chemical nature of the polymer surface may be severely modified by the UV irradiation, in an uncontrolled manner.

In a third method, described by Wittman et al, Nature 352, 414-417 (1991), orientated films of polytetrafluoroethylene (PTFE) are fabricated using a technique which transfers a bar of PTFE onto a flat surface by friction. That method can produce crystalline films of PTFE less than 100 nm thick on various substrates, and the films obtained can orientate a large number of molecular and polymer systems. However, that method suffers from major disadvantages: problems with reproducibility linked to problems with controlling the degree of covering with PTFE, and discontinuities in the polymer films obtained as well as their relatively high roughness (surface relief of the order of 30 nm).

A method for preparing orientated and nanostructured polymer surfaces (ONPS) is also known (J Petermann et al, J Mater Sci, 14, 1979, 2000 and I Lieberwirth et al, Adv Mat 110, 1998, 97). This method consists of orientating a fused support-less polymer film by hot drawing followed by crystallization during cooling. The drawbacks with that method are linked on the one hand to the difficulty in producing orientated films on a given substrate, and on the other hand to the impossibility of precisely controlling the film thickness which is vital if, for example, a polymer substrate is to be used as a gate insulator in an organic field effect transistor type architecture. Optimal charge transport in such a structure is known to be achieved in the first molecular layers in contact with the dielectric.

To overcome all of these disadvantages, the invention proposes a process for preparing a substrate with a surface, which is constituted by a film of polymer, which is both orientated and nanostructured, while controlling the roughness of said surface. Further, this process can produce substrates the orientation and structure of which remain stable over several hours even at high temperatures of the order of 130° C.

This process also has the advantage of being simple to carry out, since the substrate can be prepared at ambient temperature, and of being reproducible, and thus well suited to being carried out on an industrial scale.

To this end, in a first aspect, the invention proposes a process for preparing a substrate at least one surface of which is constituted by a polymer, said polymer surface being orientated and nanostructured, said process comprising the following steps in succession:

a) brushing the polymer surface, the substrate being in an amorphous state;

b) bringing the orientated polymer surface obtained at the ends of step a) into contact with a vapour of a solvent, said solvent being selected such that:

$|\delta_{poly} - \delta_{sol}| / [(\delta_{poly} + \delta_{sol})/2] < 0.3$, $\delta_{poly}$ and $\delta_{sol}$ representing the solubility parameters of the polymer and the solvent respectively; and $\gamma_{sol} < \gamma_{poly}$, $\gamma_{sol}$ and $\gamma_{poly}$ representing the free surface energies of the solvent and the polymer respectively.

Step a) allows the macromolecules on the polymer surface to be orientated in the same direction, and step b) can cause partial crystallization of the polymer, which causes nanostructuring of the surface and modifies the surface roughness resulting from brushing step a).

Step b) may be carried out with mixtures of solvents.

The values of the constants or the solubility parameters of a wide range of solvents and polymers have been published in the literature, in particular in U.S. Pat. No. 4,529,563 and in the publication by A F M Barton, Chem Rev, 75, no6, 731, 1975.

In one implementation, the substrate is constituted by said polymer, i.e. the substrate is a bulk polymer at least one surface of which is treated using the process of the invention.

In another implementation, the substrate is constituted by a support formed by a chemically inert material, at least one surface of which is covered with a film of polymer. The film of polymer may be deposited using various methods, for example by spin coating, brush coating, by extrusion of a polymer film, or others. The deposited polymer film typically has a thickness in the range 50 nm to several microns.

The support used may be glass slide, a silicon wafer, an indium tin oxide (ITO) conductive glass, or a metal surface.

In all cases, the support must not be altered by the process for depositing the amorphous polymer film.

The polymer used must exist in the amorphous and in the semi-crystalline form. It is preferably selected from the group comprising polyesters (polycarbonates, fluorinated polycarbonates, polyethylene terephthalate, polyethylene naphthalate, polylactic acid), and isotactic polystyrene.

When the polymer used is bisphenol A polycarbonate, the solvent may be selected from the group constituted by acetone, toluene, chlorobenzene, tetrahydrofuran and cyclohexanone.

When the polymer used is isotactic polystyrene, the solvent may be acetone.

The process of the invention may include a preliminary step for determining the conditions necessary for producing a given roughness on the polymer surface after step b).

In a first variation, this preliminary step comprises:
carrying out step a) for a series of identical substrates under identical conditions;
carrying out step b) for each substrate obtained at the end of step a) using the same solvent, at the same temperature, by varying the duration of the treatment from one substrate to another;
determining the roughness produced at the surface of each substrate after step b);
identifying the process conditions which result in the desired roughness.

The duration during which the brushed film is exposed to the solvent vapours depends on the diffusion constant of a given solvent in a given polymer; it is thus specific to each polymer/solvent pair. This duration is generally in the range 1 minute to 30 minutes.

If the time necessary to reach the desired roughness is too short, the use of a mixture of solvent vapour and air or an inert gas may be envisaged, to slow down the crystallization process.

In contrast, the treatment period may be reduced by increasing the temperature during exposure of the film to the solvent vapour.

In a second variation, this preliminary step comprises:
carrying out step a) for a series of identical substrates under identical conditions;
carrying out step b) for each substrate obtained at the end of step a) using the same solvent, for the same duration, by varying the temperature of the treatment from one substrate to another;
determining the roughness produced at the surface of each substrate after step b);
identifying the process conditions which result in the desired roughness.

After carrying out the preliminary step, the process of the invention comprises carrying out steps a) and b) under the conditions identified at the end of the preliminary step.

Thus, using routine tests, the skilled person can determine the temperature and duration conditions for carrying out step b) in order to obtain a substrate the roughness of which corresponds to the desired application.

In a second aspect, the invention pertains to a substrate constituted by a support formed from a chemically inert material at least one surface of which is covered with a film of polymer, said surface being orientated and nanostructured, and said surface having a periodic structure comprising alternating amorphous zones and crystalline lamellae, the characteristic periodicity associated with a crystalline lamella/amorphous zone sequence being in the range 5 to 100 nm.

Said support formed from a chemically inert material may be a glass slide, a silicon wafer, an indium tin oxide (ITO) conductive glass or a metal surface.

The invention also pertains to the use of a substrate in accordance with the invention for the orientated deposition of organic semiconductors (molecular and polymeric) such as pentacene, zinc phthalocyanine, coronene or organic dyes, or colloidal particles, for example particles of gold.

This deposition is preferably carried out by forming a film of molecules or macromolecules on the substrate, by vacuum sublimation or by deposition from a solution in a solvent which does not affect the structure of the substrate, the substrate being maintained at a constant temperature in the range 25° C. to 130° C.

The present invention will be illustrated below by examples which are in no way limiting in nature. Examples 1 to 3 pertain to the preparation and characterization of substrates of the invention, and Examples 4 to 7 pertain to the use of one of these substrates for the orientated deposition of various molecules.

EXAMPLE 1

This example pertains to the preparation of a substrate one surface of which is covered with a film of bisphenol A polycarbonate, the solvent used for crystallization being acetone.

A 2% by weight solution was prepared of a commercial polycarbonate (sold by Acros, with MW=64000) in dichloromethane.

Next, a film of amorphous polycarbonate was prepared by spin coating onto clean glass slides (reference: Corning 2947) at 2000 rpm.

To carry out the brushing step, an apparatus fabricated in accordance with a model described in the publication by Becker et al, Mol Cryst & Liq Cryst, 132, 167, 1986, was used.

A metal cylinder (diameter 40 mm) covered with a velvet fabric (polyamide or cotton) was applied to the polymer film with a piston exerting a pressure of 2 bars. During contact of the roller with the polymer sample, the cylinder rotated at a speed of 100-300 rpm, and the sample was translated at a constant velocity of 1 cm/s. The brushing length was of the order of 200 cm. The brushed film of polycarbonate was then exposed to a jet of nitrogen.

After brushing, the film exhibited strong optical birefringence.

Figure 2:
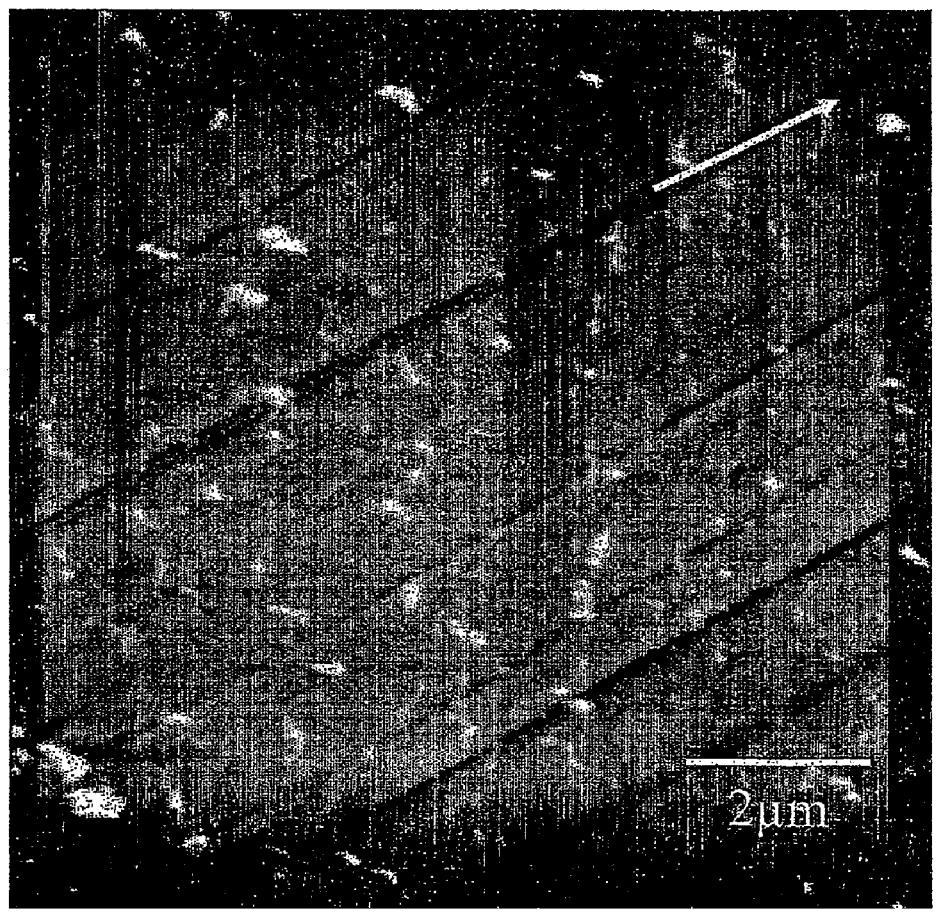

FIGS. 1 and 2 are images of a film obtained after brushing, made using an atomic force microscope, using two different scales. The surface can be seen to be ridged.

The strong optical birefringence is the result both of the presence of ridges orientated in the direction of brushing (form birefringence) and the preferential orientation of polymer chains on the surface. The polymer chains are not orientated only on the surface, but over a depth of a few nanometers.

The presence of ridges results in high roughness, of the order of 5 nm (RMS), the roughness being measured by atomic force microscopy (Tapping mode) with a Nanoscope III apparatus provided with Si tips (25-50 N/m, 280-365 kHz) over surfaces of 2×2 µm².

At this stage, the brushed films induced no significant molecular orientation of deposited materials.

To carry out the second step of the process, the brushed film of polymer was exposed to acetone vapours in a sealed glass chamber and maintained at a constant temperature (20-25° C.) in the presence of air. Under these conditions, the partial pressure of the acetone vapour was of the order of 250 mbar.

Exposing the brushed film to acetone vapours at ambient temperature caused orientated crystallization of the film, which resulted in nanostructuring of the surface, and also a significant reduction in the roughness induced by brushing, it being understood that the value of the roughness obtained depends on the duration of exposure to the acetone vapours.

Figure 3:
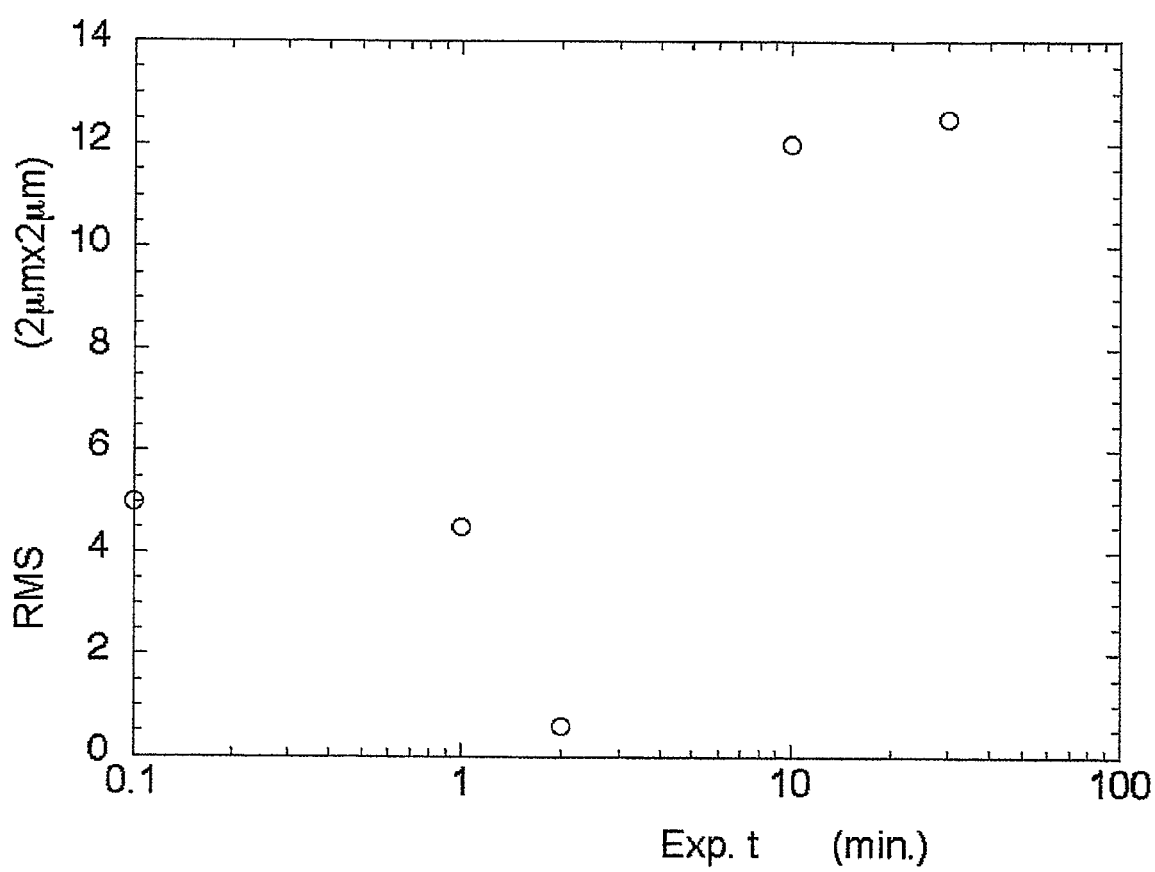

The results obtained are shown in FIG. 3, which is a graph showing the measured roughness as a function of exposure time t, in minutes. It will be seen that there is an optimum exposure period for obtaining a minimum film roughness, a high degree of orientation and surface nanostructuring. This minimum roughness value, 0.5 nm, was obtained for an exposure time of 2 minutes. This short time is particularly appropriate for certain applications such as the fabrication of field effect transistors.

Figure 4A:
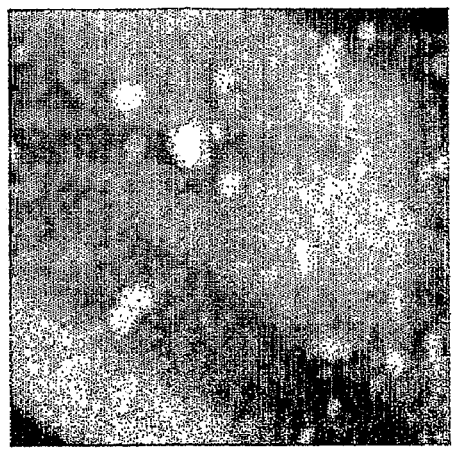
Figure 4B:
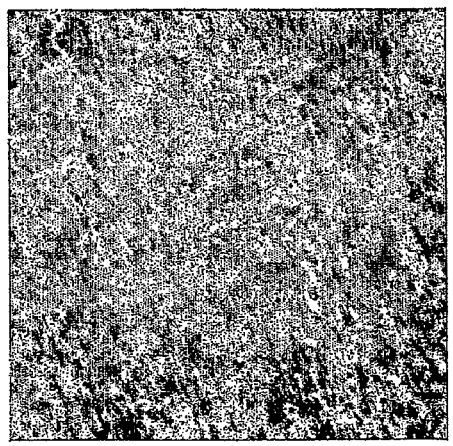
Figure 4C:
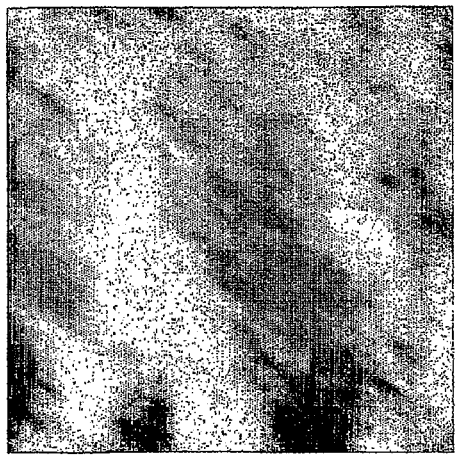

FIGS. 4a-c are topographical images produced by atomic force microscopy, representing the film surface after an acetone vapour exposure time of 1 minutes, 2 minutes and 30 minutes respectively. The measured roughness was respectively 4-5 nm (FIG. 4a), 0.5 nm (FIG. 4b) and 12 nm (FIG. 4c).

Figure 5A:
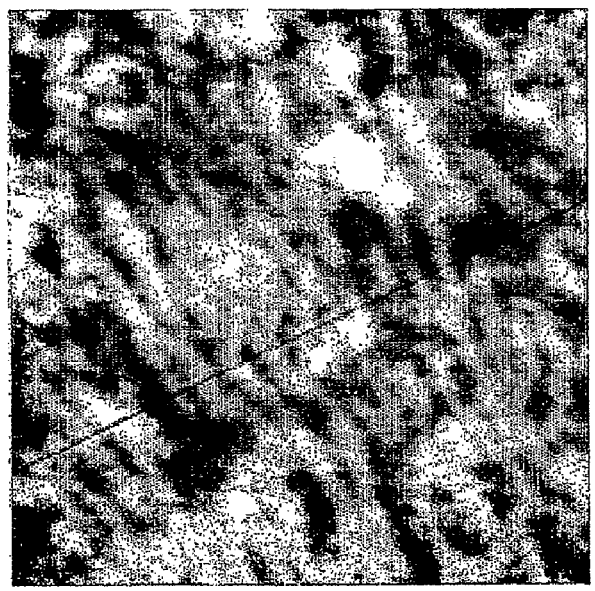
Figure 5B:
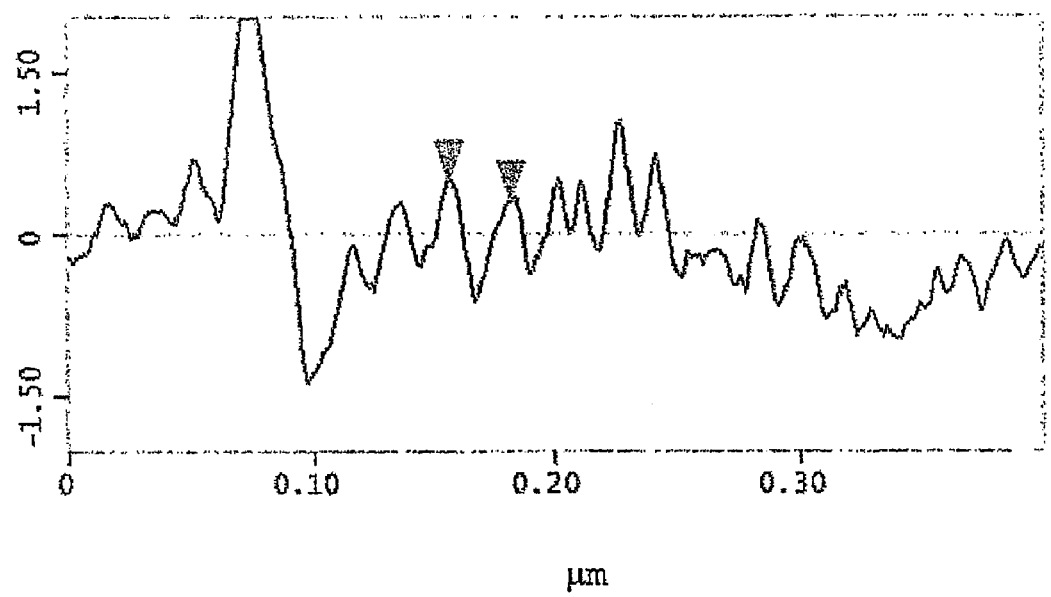
Figure 6A:
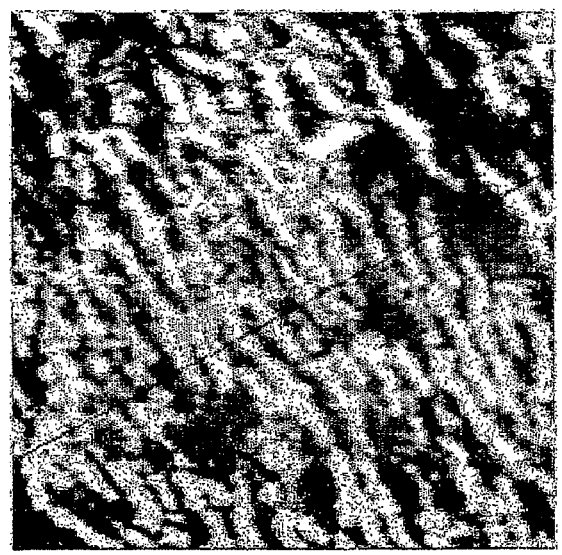
Figure 6B:
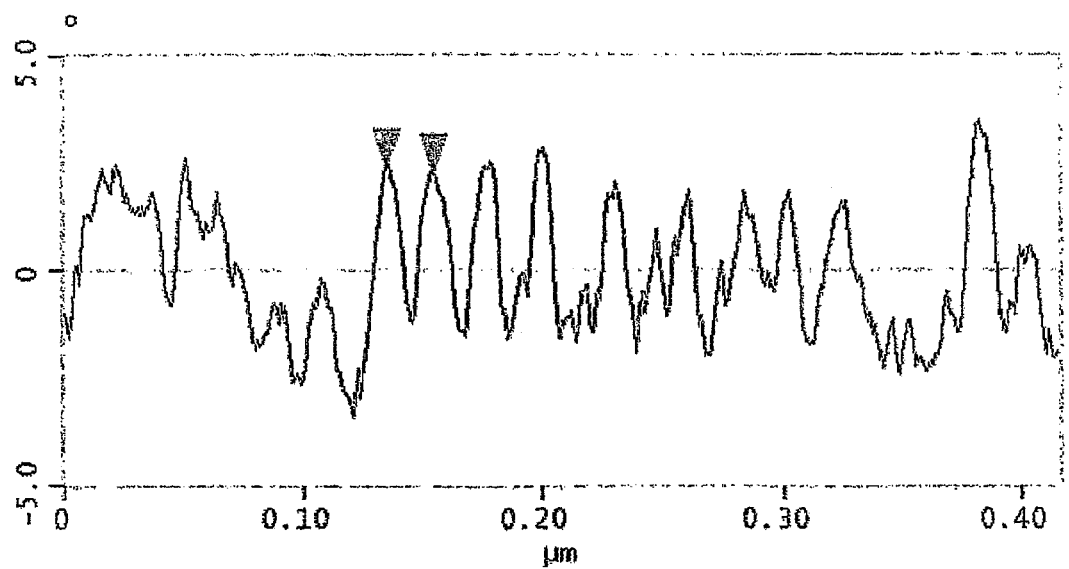

The surface nanostructuring results from an alternation of crystalline and amorphous domains which can be seen in FIGS. 5a-b (corresponding to an image obtained in topographical mode) and 6a-b (corresponding to an image in phase contrast mode) which demonstrate the existence of alternating crystalline and amorphous domains through the existence of a phase contrast. Crystalline and amorphous zones of a polymer are known to have different viscoelastic responses, giving rise to the phase contrast observed in atomic force microscopy (S S Sheiko, Advances in Polymer Sciences, vol 151, Springer Verlag, Berlin-Heidelberg, 2000). It appears that the total periodicity is of the order of 20±4 nm.

EXAMPLE 2

A substrate the surface of which was covered with a film of isotactic polystyrene was prepared; the solvent used for crystallization was acetone.

The conditions for preparing the substrate were similar to those described in Example 1, with a brushing length of 50 cm. The brushed film of polymer was exposed to acetone vapours for 2 minutes, at a temperature of 23° C.

Figure 7A:
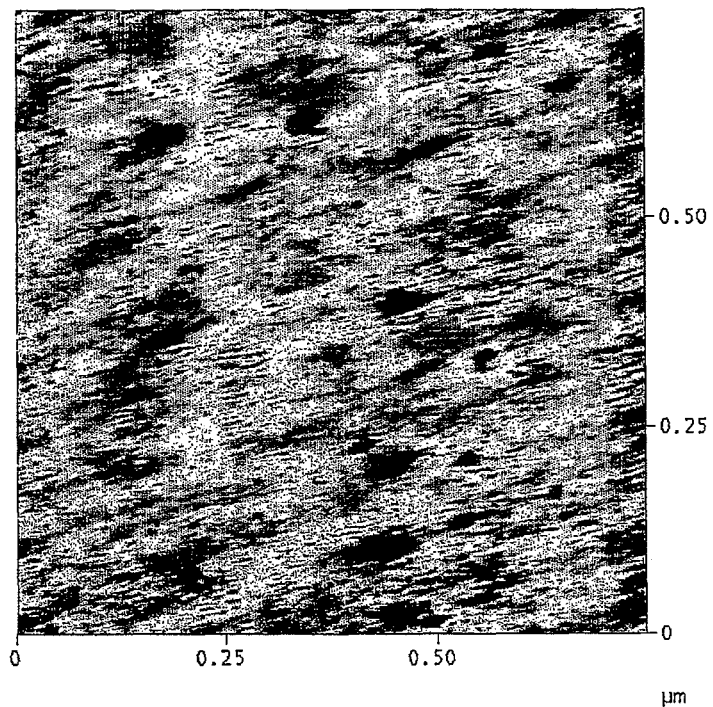
Figure 7B:
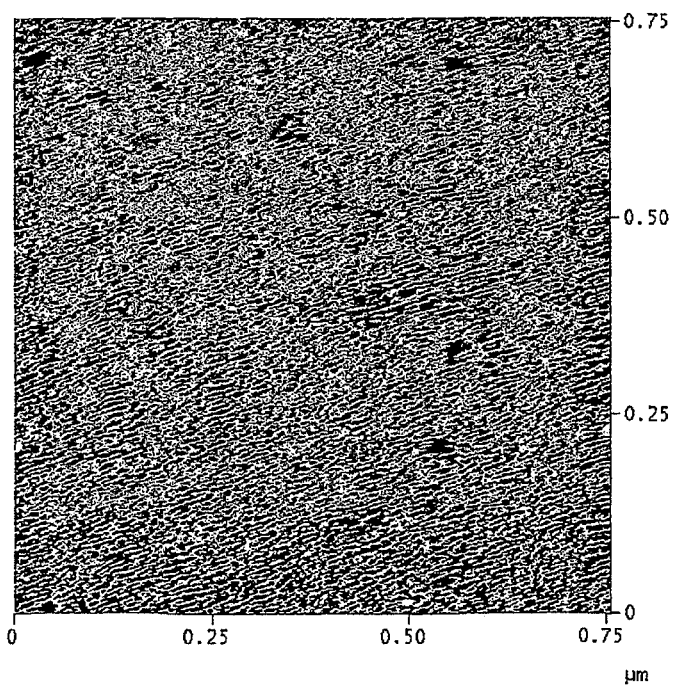

The result obtained is shown in FIGS. 7a (topography image) and 7b (phase contrast image) which demonstrate the existence of alternating crystalline and amorphous domains.

EXAMPLE 3

This example pertains to the preparation and characterization of a substrate of Si(100) with a surface covered with a film of polycarbonate.

Preparation

The Si(100) substrate used is sold by Silchem with reference 4S41/90, and has the following characteristics: wafer diameter 100 mm, resistivity 53.5 ohm/cm, thickness 460 microns.

A solution of bisphenol A polycarbonate (sold by Acros, MW=64000) was prepared in tetrachloroethane, in a concentration of 2% by weight.

Spin coating was carried out at 2000 rpm and at an acceleration of 2000 rpm/s. The Si(100) substrates had typical dimensions of 8 cm×2.5 cm. After spin coating, the films were placed in a vacuum oven at ambient temperature for a period in the range 30 minutes to 1 hour, to eliminate all traces of tetrachloroethane. This solvent has a high boiling point and its presence in the films may alter the efficiency of crystallization by the acetone vapour.

The other steps in the preparation were identical to those described in Example 1.

The thin polycarbonate films were of the order of 300 nm thick.

Characterization

The experiments described in points a) and b) were aimed at studying the structure and orientation of the polycarbonate films as a function of their duration of exposure to the solvent vapour and their depth.

Figure 8:
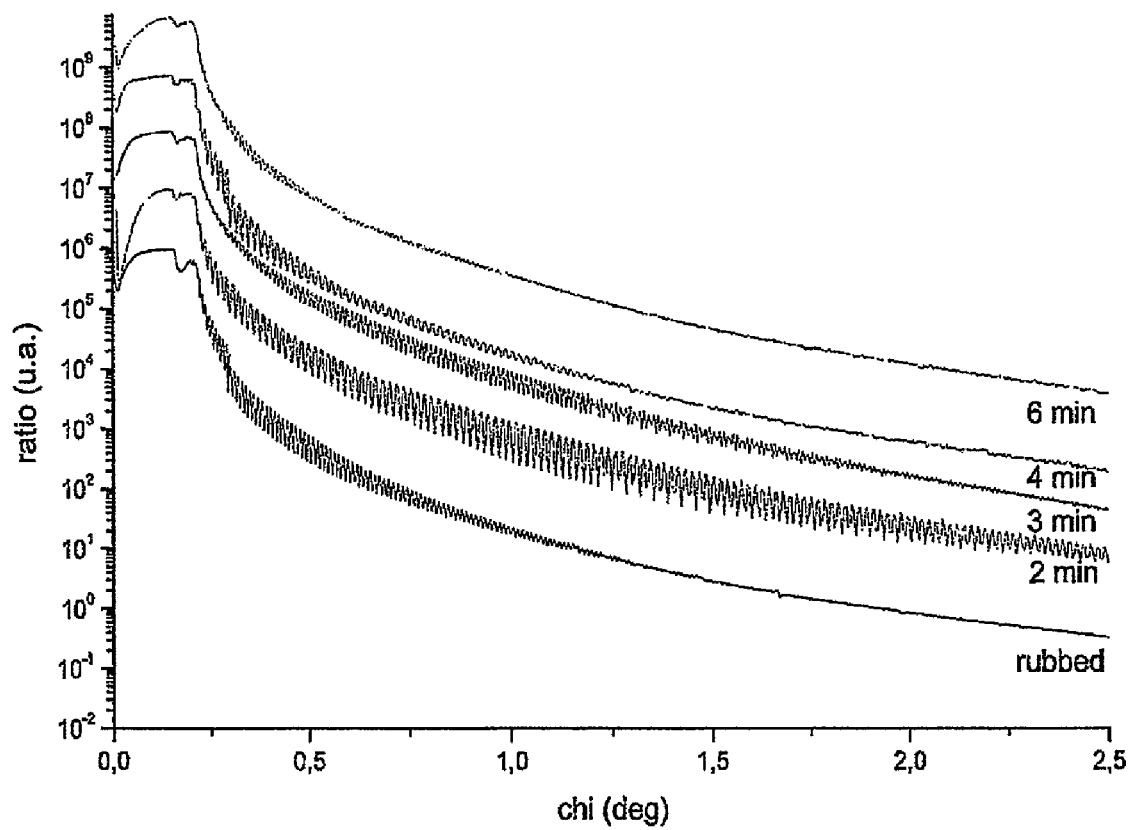

These experiments were carried out using synchrotron radiation.

a) Structure and Orientation of Films as a Function of the Period of their Exposure to Solvent Vapour The experiments were carried out on 5 different samples corresponding to periods for exposure to an acetone vapour of 0, 2, 3, 4 and 6 minutes respectively. FIG. 8 shows the change in specular reflectivity as a function of the period of exposure to acetone vapour.

The attenuation of the Kiessig fringes is linked to film roughness. For an exposure period of 2 minutes, the near absence of damping of the oscillations indicates that the surface has very low roughness. For exposure periods of more than 3 minutes, the oscillations were dampened to ever greater extents, which indicates that the roughness of the films increases with exposure time to acetone vapour, and that polycarbonate crystallization propagates towards the interior of the polymer film.

b) Structure and Orientation of Films as a Function of their Depth

Using glancing angle X ray diffraction measurements, it was possible to study the structure of the films as a function of their depth. The critical angle of total reflection was of the order of $\chi_c$=0.15 degrees. This could be used to deduce penetration depths for the X rays of the order of 6 nm for $\chi$=0.10 degrees and 60 nm for $\chi$ 0.15 degrees. For $\chi$=0.18 degrees, the penetration depth exceeds the thickness of the polymer film.

Figure 9:
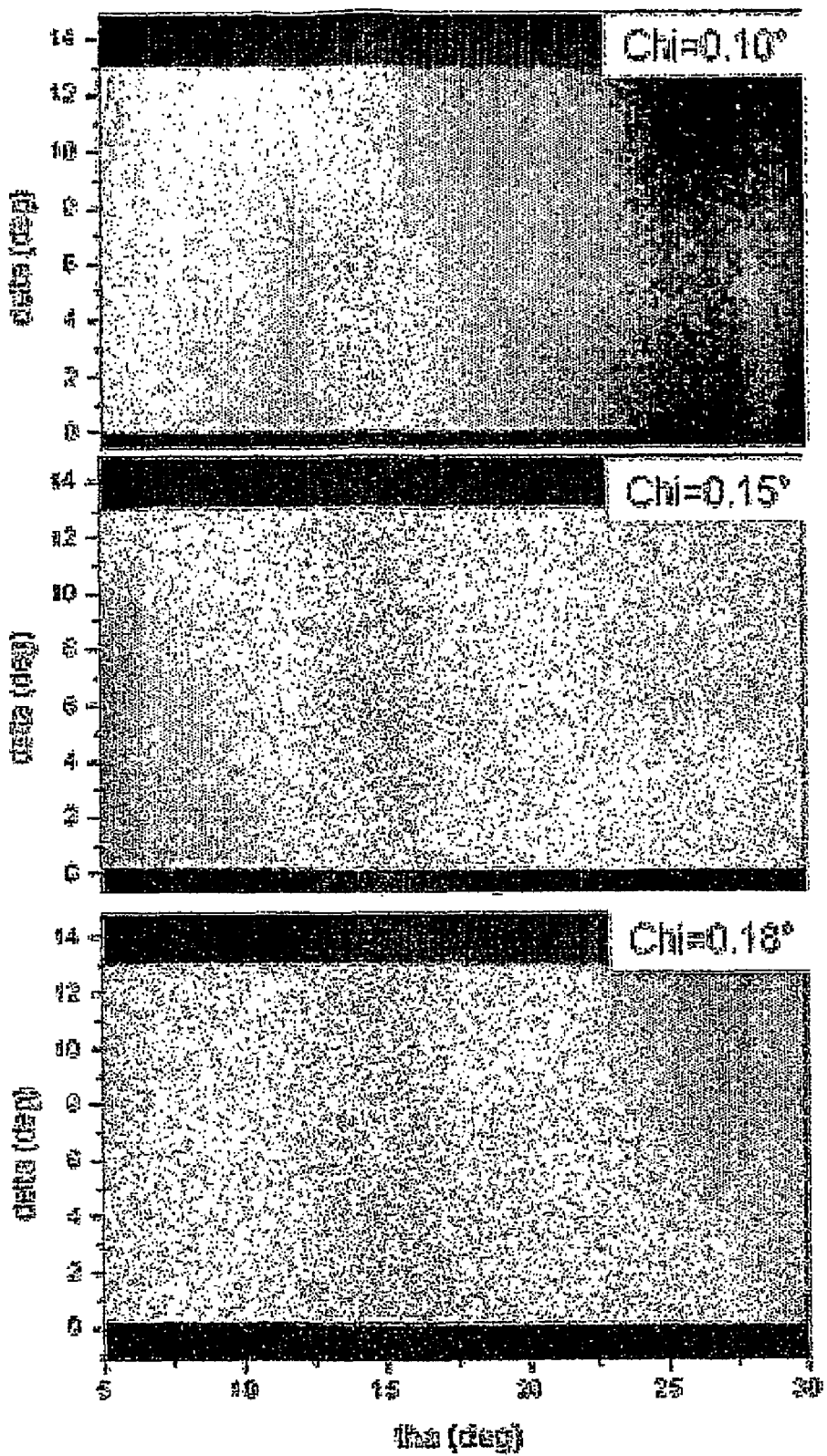

FIG. 9 shows the change in the glancing angle X ray diffraction diagram as a function of the angle of incidence $\chi$ for the orientated and nanostructured polycarbonate film. The diagrams were obtained using a PSD detector orientated perpendicular to the plane of the film in ($\theta$, 2$\theta$) geometry. The orientation $\theta$=0 is such that the incident beam is parallel to the brushing direction of the polymer films.

These experiments have identified a certain number of (hk0) type diffraction spots. The results of FIG. 9 show the existence of crystalline and orientated surface zones ($\chi$=0.10 degrees and 0.15 degrees), while the interior of the film is amorphous as indicated by the presence of an amorphous halo ($\chi$=0.18 degrees). The reflection observed for 2$\theta_B$=15.5 degrees is attributed to the (210) reflection of the monoclinic structure of the polycarbonate (see R Bonart, Die Makromoleculare Chemie, 92, 149 (1966)).

Further, these experiments allowed the angular dispersion in the plane of the substrate of the orientation of the crystalline lamellae of polycarbonate to be measured ($\Delta\omega\approx$25 degrees (half-width at half-height).

The results of FIG. 9 also show that the surface of the crystalline polycarbonate lamellae correspond to dense (010) type planes. This result is unexpected given that conventional brushing techniques result in orientated polymer films having fiber symmetry (uniaxial system) while the system of the invention has a biaxial orientation.

Several examples of an application of the polycarbonate substrate the fabrication of which was described in Example 1 will now be described.

In these examples, organic films of pentacene, zinc phthalocyanine and diazo dyes as well as films of gold were prepared by vacuum sublimation onto the polycarbonate substrate maintained at a constant temperature in the range 25° C. to 130° C.

Typically, a film was fabricated by vacuum evaporation using a commercial Auto 306 (BOC Edwards) type evaporator. The high vacuum used was in the range $10^{-5}$ to $10^{-7}$ mbar.

When the product to be deposited was an organic material, the source of evaporation was constituted by a quartz crucible containing the product to be deposited. The crucible was heated resistively by a tungsten filament. A quartz balance was used to measure the rate of deposition (in nm/min) and the thickness of the films. The orientated polymer substrate was placed on a sample carrier which could be heated, located at a distance between 10 cm and 30 cm from the source.

The temperature of the crucible was increased until the desired rate of deposition (between 1 and 10 nm/min) was reached. A mask located in front of the substrate was then withdrawn to start deposition onto the substrate. When the desired thickness had been reached, the mask was replaced in front of the sample. The sample was removed from the evaporator only when the temperature of the substrate had returned to a temperature approaching ambient temperature.

To deposit gold, the source used was generally a simple resistively heated tungsten wire around which a piece of gold wire to be evaporated had been wound (about 1 cm in length, 25 microns in diameter).

EXAMPLE 4

Orientated Deposition of Pentacene

Figure 10A:
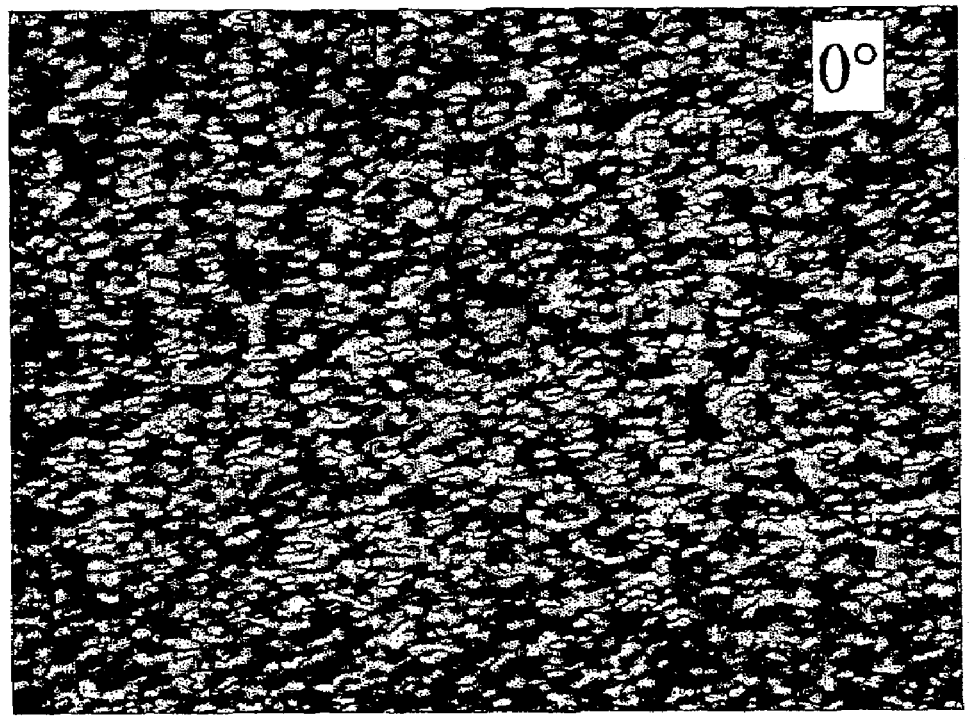
Figure 10B:
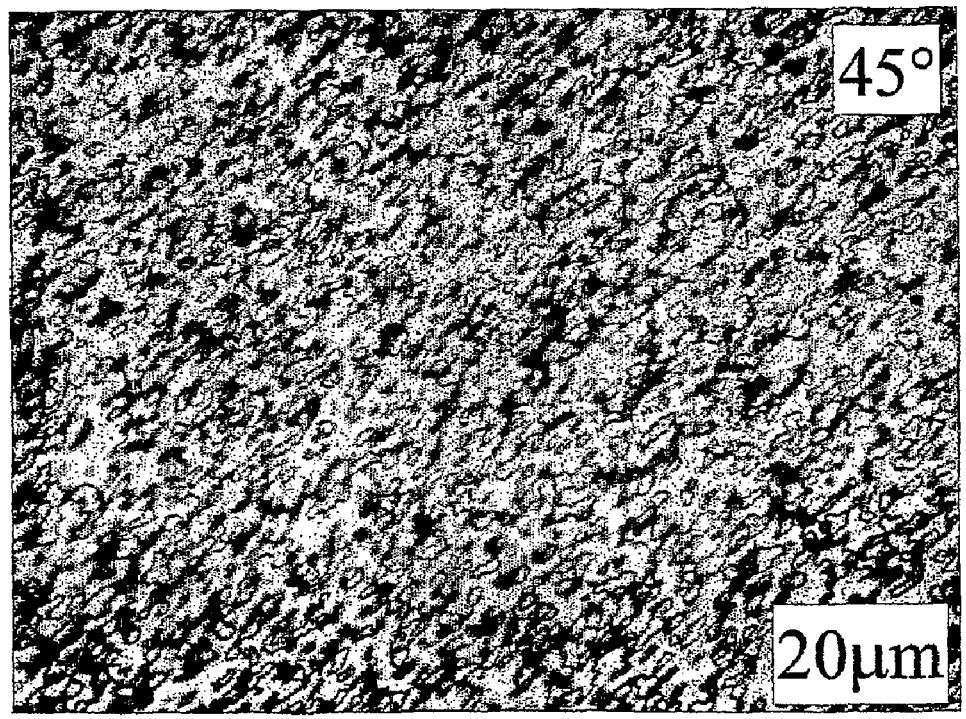
Figure 11:
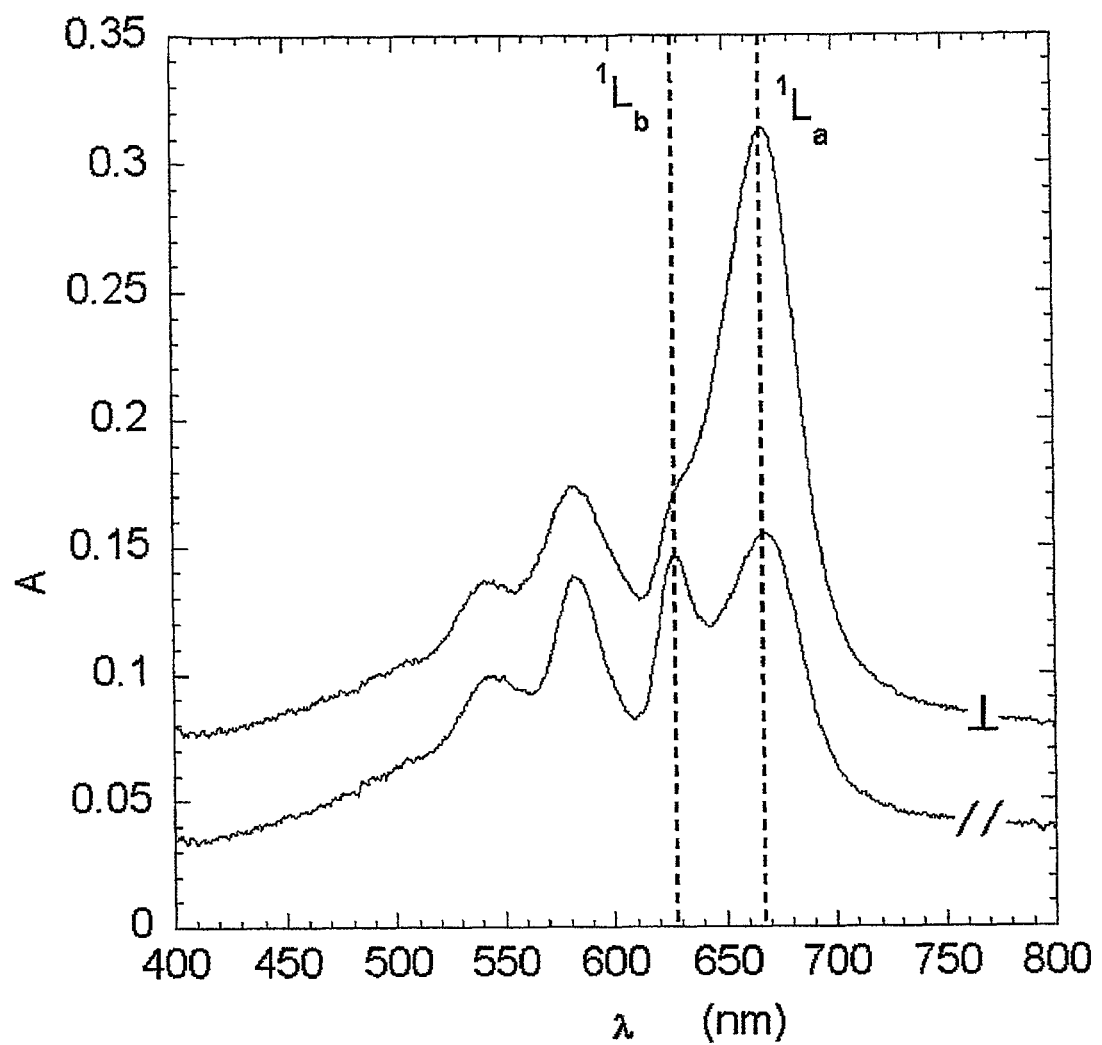

This molecule is an organic semiconductor used for the fabrication of field effect transistors. The optical microscopy images (FIGS. 10a and 10b) and the graph representing the absorbance A as a function of the wavelength lambda, in nanometers; (FIG. 11) respectively highlight a high birefringence and a strong anisotropy in the optical absorption. These results imply a high degree of orientation of the molecules on the substrate, which was similar to that obtained for orientated PTFE substrates (see M Brinkmann et al, J Phys Chem B, 107, 10531, 2003).

EXAMPLE 5

Orientated Deposition of Zinc Phthalocyanine

Figure 12A:
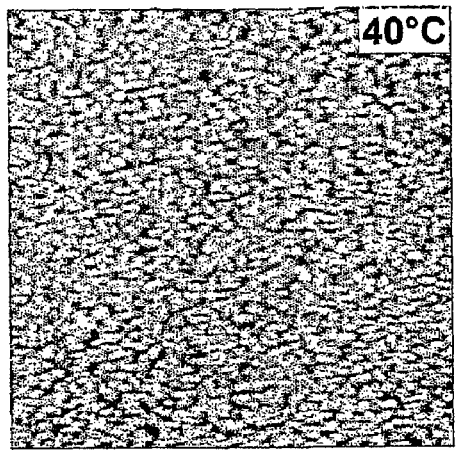
Figure 12B:
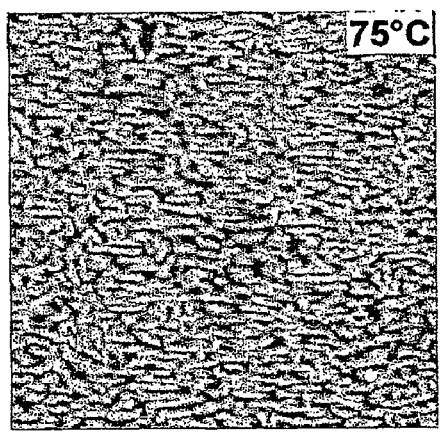
Figure 12C:
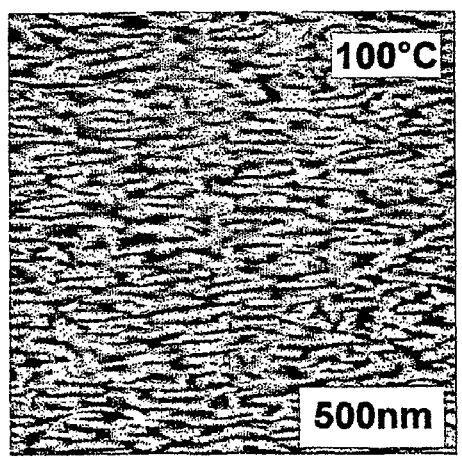
Figure 13A:
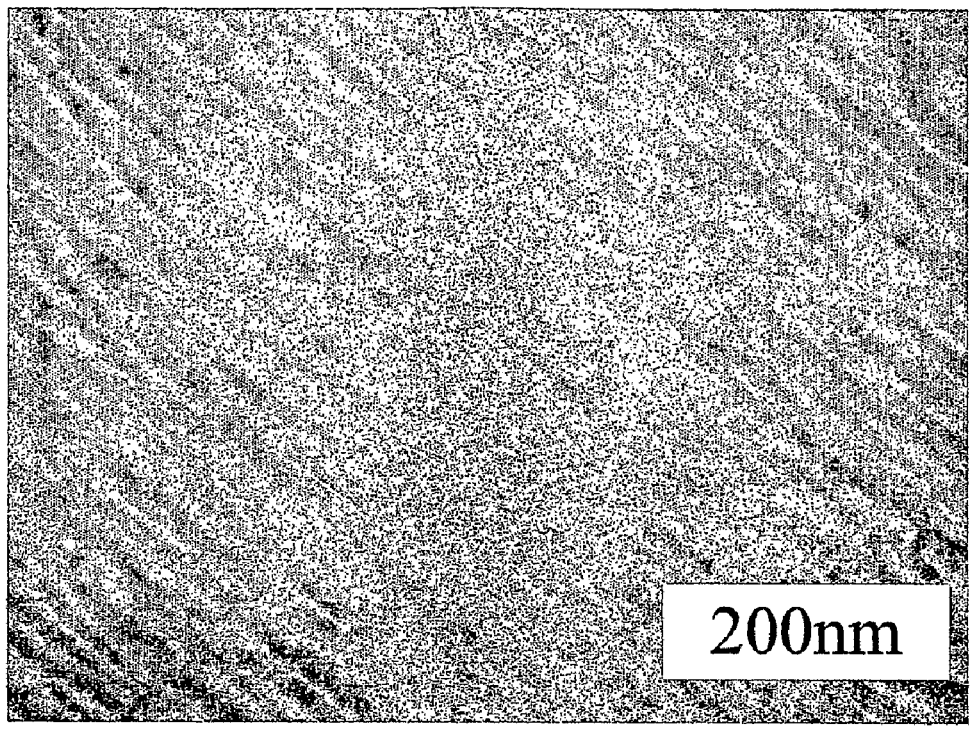
Figure 13B:
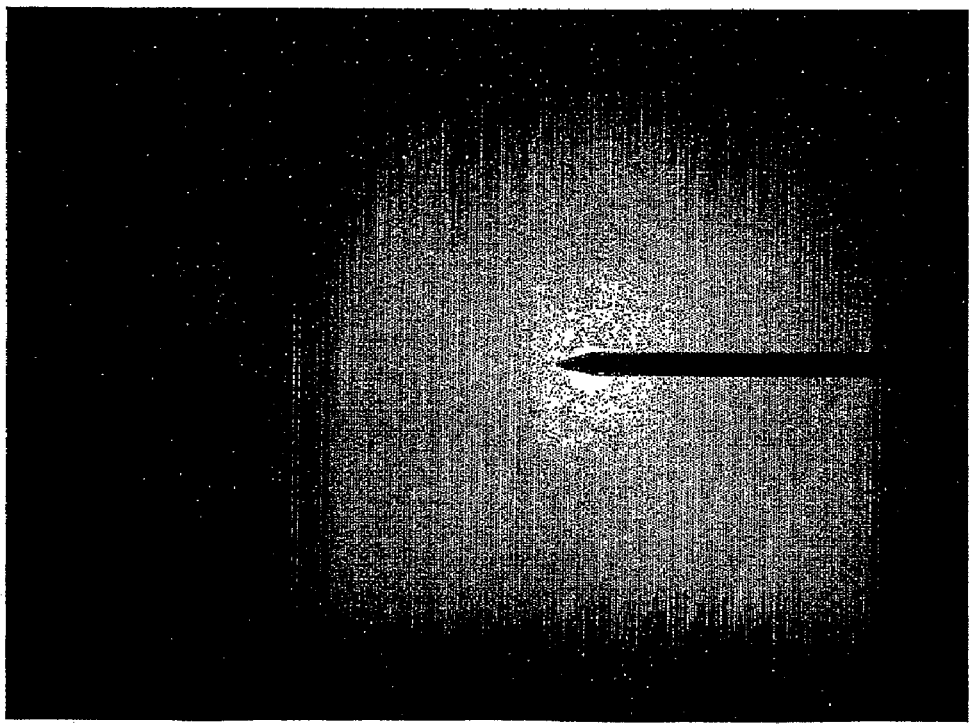

FIGS. 12a-c show topographical images obtained by atomic force microscopy on thin films of zinc phthalocyanine ZnPc (50 nm) deposited on an orientated polycarbonate substrate for respective deposition temperatures of 40° C., 75° C. and 100° C. FIGS. 13a-b respectively show a bright field image and the corresponding diffraction image for a film of phthalocyanine with a thickness of 50 nm deposited at a substrate temperature Ts of 100° C. The results obtained show that the degree of orientation of the zinc phthalocyanine increased with substrate temperature, and that the orientation of the substrate was maintained up to a temperature of 100° C. Supplemental experiments have shown that the orientating power of the substrates was maintained up to at least Ts=130° C.

Electron microscopic analysis of the degree of orientation showed the presence of elongate crystals of zinc phthalocyanine (FIG. 13) and the production of very fine diffraction spots (FIG. 13b), indicating uniformity over the whole surface.

EXAMPLE 6

Orientated Deposition of Coronene

Figure 14A:
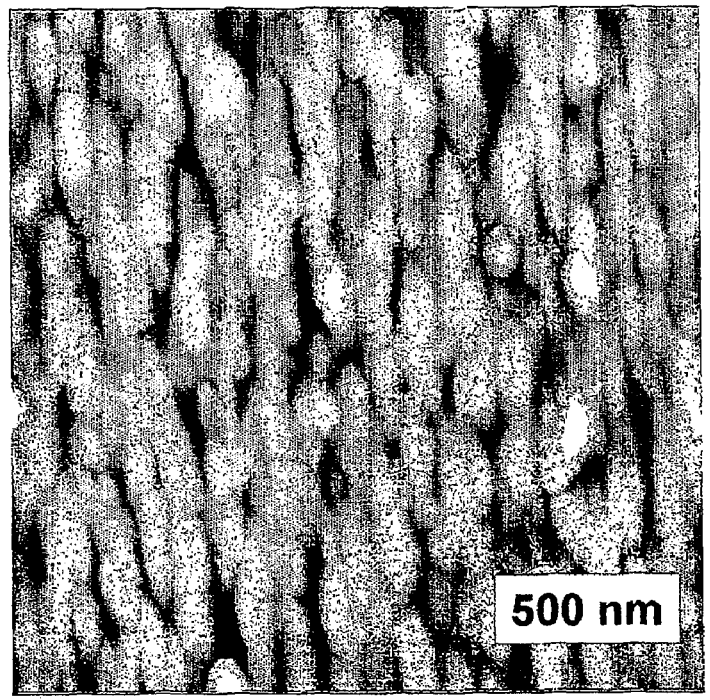
Figure 14B:
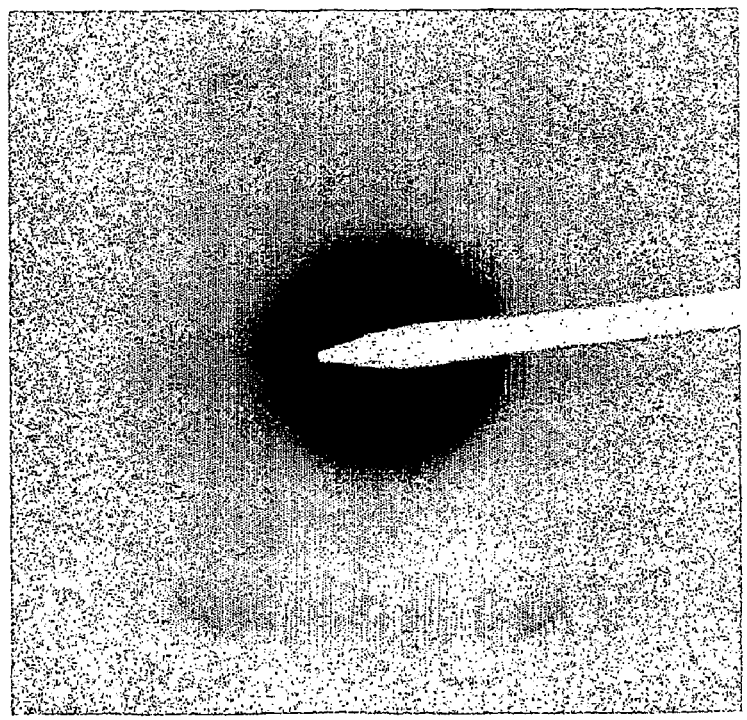

The topographical image (FIG. 14a) obtained by atomic force microscopy of a thin film of coronene (50 nm) deposited on a substrate of orientated polycarbonate at a substrate temperature Ts of 29° C. shows a surface constituted by orientated crystals, while the corresponding diffraction image (FIG. 14b) showed slightly arcuate diffraction points, demonstrating a high degree of orientation similar to that observed for phthalocyanine.

EXAMPLE 7

Orientated Deposition of Gold Nanoparticles

Figure 15:
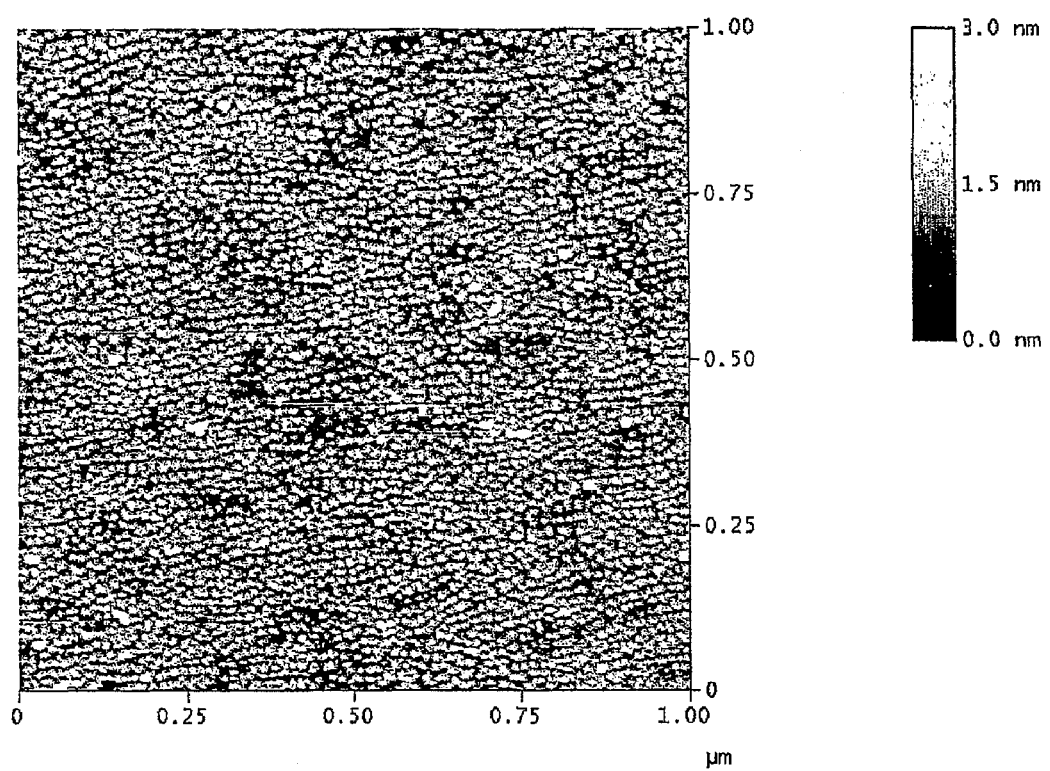
Figure 16:
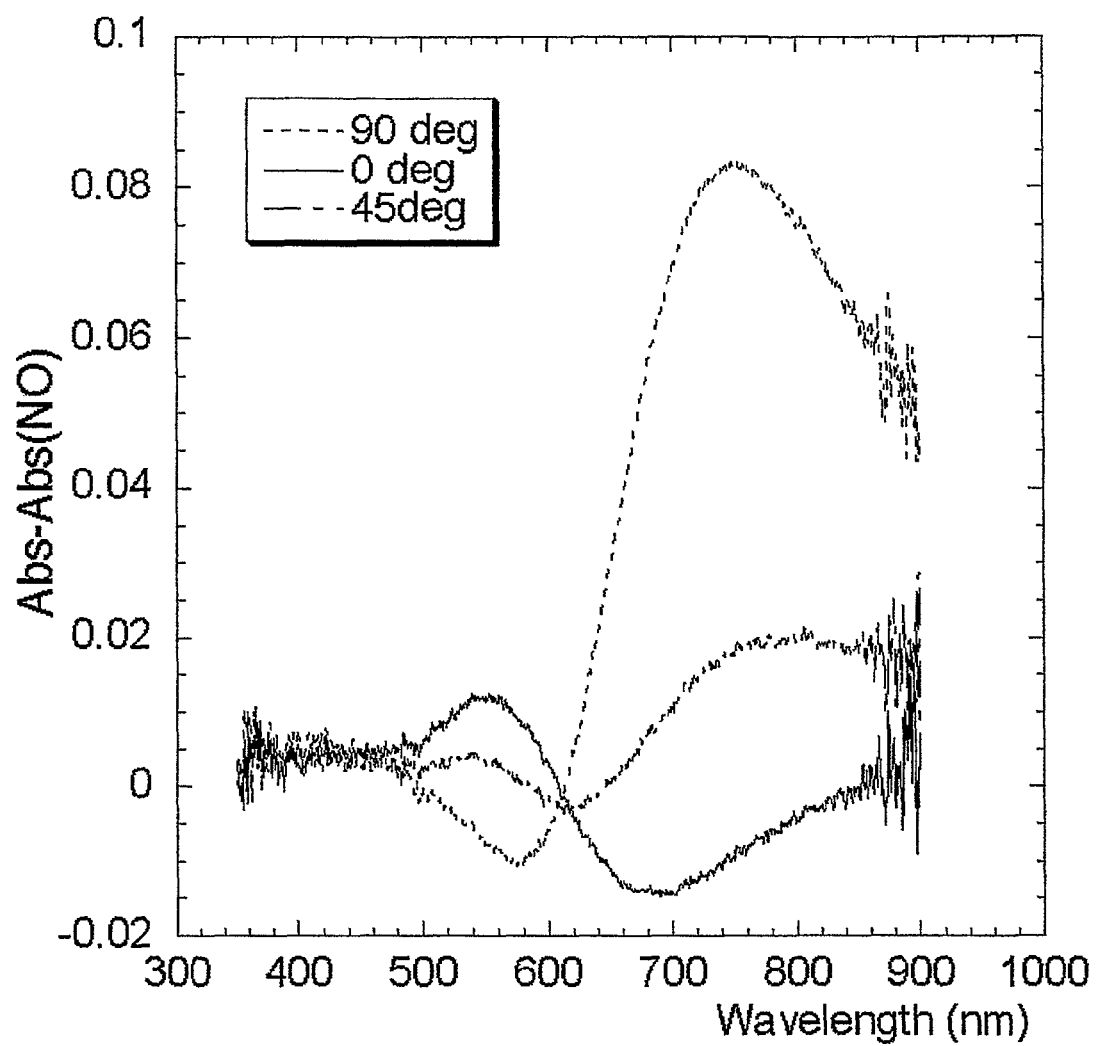

Deposition of about 10 nanometers of gold by evaporation onto an orientated and nanostructured polycarbonate substrate gave rise to the formation of gold nanoparticles with a relatively narrow size distribution. Atomic force microscopy (FIG. 15) showed a marked alignment of nanoparticles by the nanostructured surface of the substrate. The optical absorption of these films was polarized and had an absorption maximum at about 700 nm when the polarization of the incident wave was orientated perpendicular to the direction of brushing of the polycarbonate substrates (FIG. 16, representing the absorbance as a function of the wavelength lambda, in nanometers). It should be noted that the optical absorption was measured by taking a film of gold on non-orientated PC as the reference.

EXAMPLE 8

Orientated Deposition of Azo Dyes

Figure 17:
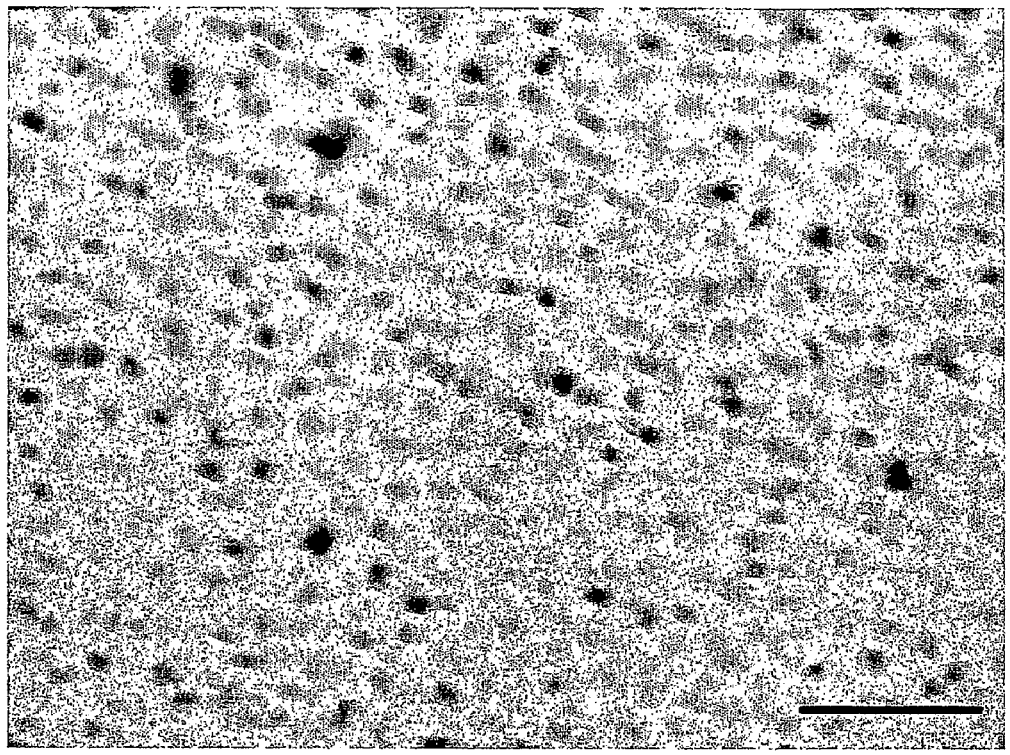

The bright field image obtained by transmission electron microscopy of a thin film (50 nm) of a diazo dye with formula (I) below deposited on an orientated polycarbonate substrate at a substrate temperature Ts of 29° C. is shown in FIG. 17.

(I)

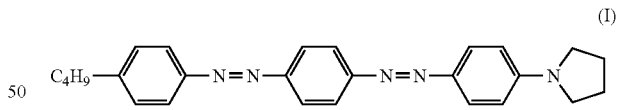

Figure 18:
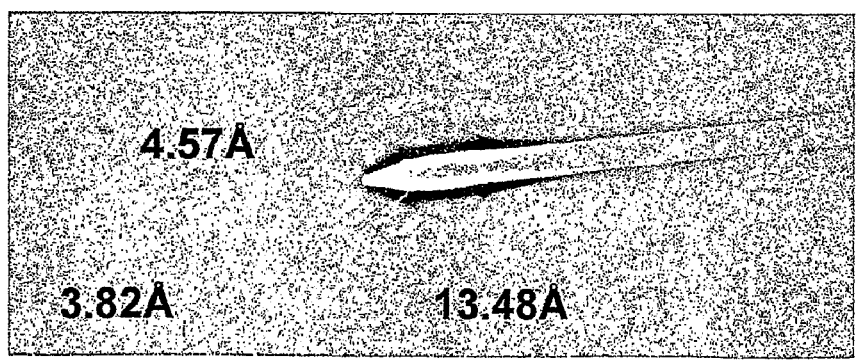

For this film, polarized absorption measurements showed substantial anisotropy of the optical absorption. The absorption maximum was obtained when the polarization of the incident wave was orientated perpendicular to the direction of brushing. The dichroic ratio, defined as the ratio of the perpendicular absorption to the parallel absorption, measured at 560 nm, readily attained a value of the order of 20. The electron diffraction measurements produced a diffraction image with slightly arcuate spots (FIG. 18), demonstrating a high degree of orientation of the films.

The invention claimed is:
1. A process for preparing a substrate at least one surface of which is constituted by a polymer, wherein said process comprises the following steps in succession:

a) brushing the polymer surface when the substrate is in an amorphous state so as to orientate macromolecules of the polymer in the same direction;

b) bringing the polymer surface obtained at the end of step a) into contact with a vapor of a solvent so as to partially crystallize the polymer and cause nanostructuring of said surface, said solvent being selected such that:

$|\delta_{poly}-\delta_{sol}|/[(\delta_{poly}+\delta_{sol})/2]<0.3$, $\delta_{poly}$ and $\delta_{sol}$ representing the solubility parameters of the polymer and the solvent respectively; and $\gamma_{sol}<\gamma_{poly}$, $\gamma_{sol}$ and $\gamma_{poly}$ representing the free surface energies of the solvent and the polymer respectively.

2. The process according to claim 1, wherein the substrate is constituted by said polymer.

3. The process according to claim 1, wherein the substrate is constituted by a support formed by a chemically inert material at least one surface of which is covered with a film of polymer.

4. The process according to claim 3, wherein the polymer film has a thickness equal to or greater than 50 nm.

5. The process according to claim 1, wherein said polymer is selected from the group consisting of polyesters and isotactic polystyrene.

6. The process according to claim 5, wherein the polymer is bisphenol A polycarbonate.

7. The process according to claim 6, wherein the solvent is selected from the group consisting of acetone, toluene, chlorobenzene, tetrahydrofuran and cyclohexanone.

8. The process according to claim 5, wherein said polymer is selected from the group consisting of polycarbonates (bisphenol A), fluorinated polycarbonates, polyethylene terephthalate and naphthalate and polylactic acid.

9. The process according to claims 5 or 8, wherein the solvent is acetone.

10. The process according to claim 1, wherein said process comprises a preliminary step to determine the conditions necessary to produce a given roughness of the polymer surface after step b).

11. The process according to claim 10, wherein the preliminary step comprises:

carrying out step a) for a series of identical substrates under identical conditions;

carrying out step b) for each substrate obtained at the end of step a) using the same solvent, at the same temperature, by varying the duration of the treatment from one substrate to another;

determining the roughness produced at the surface of each substrate after step b);

identifying the process conditions which result in the desired roughness.

12. The process according to claim 10, wherein the preliminary step comprises:

carrying out step a) for a series of identical substrates under identical conditions;

carrying out step b) for each substrate obtained at the end of step a) using the same solvent, for the same duration, by varying the temperature of the treatment from one substrate to another;

determining the roughness produced at the surface of each substrate after step b);

identifying the process conditions which result in the desired roughness.

13. The process according to claim 11 or claim 12, wherein after carrying out the preliminary step, steps a) and b) are carried out under the conditions identified at the end of the preliminary step.

14. The process of claim 1, wherein the partially-crystallized polymer has a periodic structure comprising alternating amorphous zones and crystalline lamellae, the periodicity associated with a crystalline lamella/amorphous zone sequence being in the range of 5 to 100 nm.

15. The process of claim 3, wherein the support is a glass slide, a silicon wafer, a conductive glass, or a metal surface.

16. The process of claim 1, wherein said process comprises a further step consisting of depositing organic semiconductors, pentacene, zinc phthalocyanine, coronene, organic dyes, colloidal particles or gold particles on the polymer surface.

* * * * *